United States Patent
Hyman et al.

(10) Patent No.: US 11,562,831 B2
(45) Date of Patent: Jan. 24, 2023

(54) WIRE ASSEMBLY USEFUL IN APPLICATIONS THAT ARE IN CLOSE PROXIMITY TO ANTENNA

(71) Applicant: IXI Technology Holdings, Inc., Yorba Linda, CA (US)

(72) Inventors: Daniel Hyman, Long Beach, CA (US); Jeffrey Norris, Lake Forest, CA (US)

(73) Assignee: IXI TECHNOLOGY HOLDINGS, INC., Yorba Linda, CA (US)

( * ) Notice: Subject to any disclaimer, the term of this patent is extended or adjusted under 35 U.S.C. 154(b) by 59 days.

(21) Appl. No.: 16/746,934

(22) Filed: Jan. 19, 2020

(65) Prior Publication Data

US 2021/0227728 A1 Jul. 22, 2021

(51) Int. Cl.
| | |
|---|---|
| *H01B 7/02* | (2006.01) |
| *H05K 9/00* | (2006.01) |
| *H01B 11/02* | (2006.01) |
| *H01B 11/18* | (2006.01) |
| *H01B 11/10* | (2006.01) |
| *H01Q 11/08* | (2006.01) |

(52) U.S. Cl.
CPC ........... *H01B 7/0241* (2013.01); *H01B 11/02* (2013.01); *H01B 11/1025* (2013.01); *H01B 11/1895* (2013.01); *H05K 9/0083* (2013.01); *H01Q 11/08* (2013.01)

(58) Field of Classification Search
CPC ............................ H01B 11/1083; H01B 11/06
See application file for complete search history.

(56) References Cited

U.S. PATENT DOCUMENTS

| | | | | |
|---|---|---|---|---|
| 3,576,387 A * | 4/1971 | Derby | ................... | H01B 9/027 252/511 |
| 4,555,422 A * | 11/1985 | Nakamura | ............... | H01R 4/72 428/483 |
| 2003/0186602 A1* | 10/2003 | Millas | .................. | D06N 3/0063 442/181 |
| 2005/0057430 A1* | 3/2005 | Noguchi | ................ | H01Q 5/321 343/702 |
| 2012/0241213 A1* | 9/2012 | Yu | ............................ | H01Q 1/46 174/70 R |
| 2013/0249749 A1* | 9/2013 | Nitta | ........................ | H01Q 1/38 343/720 |
| 2015/0235738 A1* | 8/2015 | Nakatani | ................ | H01B 9/006 174/34 |
| 2017/0027090 A1* | 1/2017 | Sumi | ........................ | H01B 7/18 |

(Continued)

*Primary Examiner* — Paresh Paghadal
(74) *Attorney, Agent, or Firm* — The Watson IP Group, PLC; Jovan N. Jovanovic

(57) ABSTRACT

An antenna installation having an antenna and a wire assembly. The antenna has a first end and a second end, with the antenna having a radiative distribution pattern and RF input characteristics. The wire assembly is positioned in close proximity to the antenna. The wire assembly includes a conductor and an RF insulative wrap. The conductor has a first end and a second end and at least one conductive element extending between the first end and the second end. The RF insulative wrap encircles the conductor between the first end and the second end. The RF insulative wrap includes a magnetic sheet having a magnetic metal powder within a polymer matrix. A method of preparing a wire assembly as well as the wire assembly itself are likewise disclosed.

7 Claims, 4 Drawing Sheets

(56) References Cited

U.S. PATENT DOCUMENTS

| | | | |
|---|---|---|---|
| 2017/0237145 A1* | 8/2017 | Di Renzo | E21B 43/2401 166/60 |
| 2018/0159367 A1* | 6/2018 | Louzir | G06K 19/071 |
| 2021/0090765 A1* | 3/2021 | Wakeen | H01B 11/1008 |

* cited by examiner

WIRE ASSEMBLY USEFUL IN APPLICATIONS THAT ARE IN CLOSE PROXIMITY TO ANTENNA

CROSS-REFERENCE TO RELATED APPLICATION

N/A

BACKGROUND OF THE DISCLOSURE

1. Field of the Disclosure

The disclosure relates in general to wire assemblies, and more particularly, to a wire assembly that is well suited for use in close proximity to one or more antennas. It will be understood that close proximity, while not a particular distance value, is typically referring to installations wherein a wire assembly is in proximity to one or more antennas such that the antenna's radio frequency (RF) characteristics are undesirably affected.

2. Background Art

It is well known in the art of antenna design that the near-field presence of conductive bodies to an antenna that is, for example, transmitting an RF signal has an effect on the frequency-dependent input reflection and/or radiation pattern of the antenna. It is often the case that any wiring or conductors required to be in proximity with an antenna be routed or spaced specifically to minimize these effects. A technique typically used in the RF industry is to first direct wiring and other conductors away from the antenna and then maintain a generally larger distance from the antenna so that the effect on the antenna can be minimized. It is recognized that with certain types of antennas and antenna arrays that wiring can be placed in particular arrangements using symmetry, direction, and spacing to minimize impact.

While such methodologies have been utilized for some antenna implementations, it is not always possible to direct conductors, wiring or other metal bodies at a distance, especially in non-ideal systems comprising multiple antennas and cable assemblies in close proximity (although the disclosure is not limited to use in such configurations). In some instances the entire design of a particular antenna installation has to be redesigned due to undesirable effects that such bodies have on the radiative distribution pattern of the antenna. A common example is a system having multiple antennas, where the feed cable of one antenna passes in close proximity to a second antenna. It will be understood that the disclosure is not limited to any particular use of such a conductor or the use of such a conductor within the system.

SUMMARY OF THE DISCLOSURE

The disclosure is directed, in an aspect, to a wire assembly comprising a conductor and an RF insulative wrap. The conductor has a first end and a second end. The conductor further includes at least one conductive element extending between the first end and the second end. The conductor may itself have a non-conductive coating with dielectric properties which provides direct current (DC) and alternating current (AC) insulation, but typically not RF insulation. Furthermore, the conductor may itself have a conductive shield, such as, for example, the RF grounding shield of a coaxial cable. Such a coating provides DC, AC, and RF isolation between the outer conductive shield and the inner conductor, but such an arrangement can still be seen as a potentially detrimental conductor to nearby antennas. The RF insulative wrap encircles the conductor between the first end and the second end. The insulative wrap has a magnetic sheet having a magnetic metal powder within a polymer matrix.

In some configurations, the at least one conductive element comprises a pair of conductive elements in a coaxial configuration. In some configurations, the at least one conductive element comprises a pair of conductive elements side by side (parallel to each other), parallel wires within a conductive shield, and may be twisted relative to each other, or in a triaxial configurations, among other configurations.

In some configurations, the insulative wrap comprises a helical winding along the conductor between the first end and the second end.

In some configurations, the helical winding is formed from a strip having a first side edge and a second side edge opposite the first side edge defining a width. The helical winding overlaps itself between the first end and the second end.

In some configurations, the overlap is between 5% and 50% of the width of the strip.

In some configurations, the helical winding extends from the first end to the second end, completely wrapping the conductor.

In some configurations, the insulative wrap comprises a tube of thermoconstrictive polymer, aka "heat shrink".

In some configurations, the magnetic sheet includes a top surface and a bottom surface opposite the top surface, an adhesive layer applied to the bottom surface of the magnetic sheet and a surface film applied to the top surface of the magnetic sheet.

In some configurations, the magnetic sheet has a thickness of between 0.02 mm and 2.00 mm and more preferably between 0.05 mm and 0.50 mm.

In some configurations, the wire assembly further has a first connector at the first end of the conductor and a second connector at the second end of the conductor. The conductor may comprise a point to point connector or a branched cable assembly, with multiple first ends and/or multiple second ends.

In another aspect of the disclosure, the disclosure is directed to an antenna installation that includes an antenna and a wire assembly. The antenna has a first end and a second end with the antenna having a radiative distribution pattern and RF input impedance characteristics. A wire assembly is positioned in close proximity to the antenna. The wire assembly includes a conductor and an RF insulative wrap. The conductor has a first end and a second end, and at least one conductive element extending between the first end and the second end. The RF insulative wrap encircles the conductor between the first end and the second end. The RF insulative wrap comprises a magnetic sheet having a magnetic metal powder within a polymer matrix.

In some configurations, the wire assembly is positioned within 18" of the antenna.

In some configurations, the wire assembly is positioned so as to be extending along a portion of the antenna between a first end and a second end of the antenna.

In some configurations, the antenna is one of a helical, Yagi, quasi-Yagi, log-periodic, Vivaldi, and other slot-based antenna.

In some configurations, the at least one conductive element comprises a pair of conductive elements in at least one of a coaxial arrangement, a twisted pair arrangement, and a side by side arrangement.

In some configurations, the at least one conductive element comprises a plurality of six conductive elements in a parallel arrangement wherein a pair of conductive elements are separated from the other conductive elements part-way along the length.

In some configurations, the RF insulative wrap comprises a helical winding along the conductor between the first end and the second end.

In some configurations, the helical winding is formed from a strip having a first side edge and a second side edge opposite the first side edge defining a width, wherein the helical winding overlaps itself between the first end and the second end.

In some configurations, current passes through the conductor between the first end and the second end.

In yet another aspect of the disclosure, the disclosure is directed to a method of preparing a wire assembly that has the steps of: providing a conductor having a first end and a second end with at least one conductive element extending between the first end and the second end; and providing an insulative wrap comprising a magnetic sheet having a soft magnetic metal powder within a plastic matrix; and encircling the conductor between the first end and the second end.

In some configurations, the method of preparing a wire assembly further comprises the step of installing the wire assembly in close proximity to an antenna.

BRIEF DESCRIPTION OF THE DRAWINGS

The disclosure will now be described with reference to the drawings wherein.

DETAILED DESCRIPTION OF THE DISCLOSURE

Figure 1:
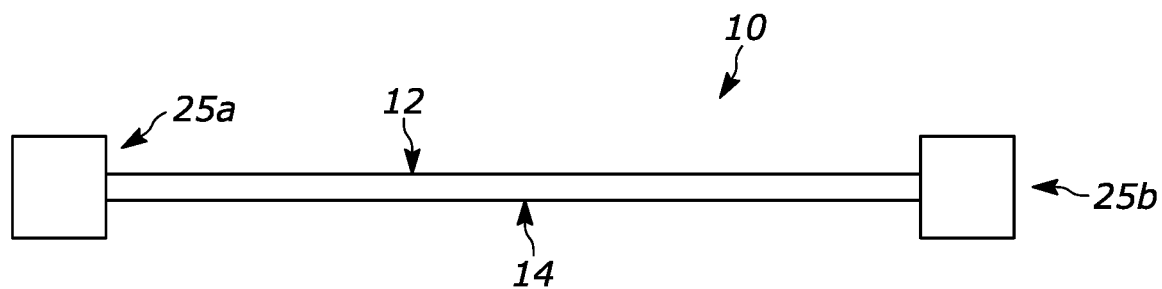
FIG. 1 of the drawings is a side elevational view of a configuration of the wire assembly of the present disclosure.

While this disclosure is susceptible of embodiment in many different forms, there is shown in the drawings and described herein in detail a specific embodiment(s) with the understanding that the present disclosure is to be considered as an exemplification and is not intended to be limited to the embodiment(s) illustrated.

It will be understood that like or analogous elements and/or components, referred to herein, may be identified throughout the drawings by like reference characters. In addition, it will be understood that the drawings are merely schematic representations of the invention, and some of the components may have been distorted from actual scale for purposes of pictorial clarity.

Figure 2:
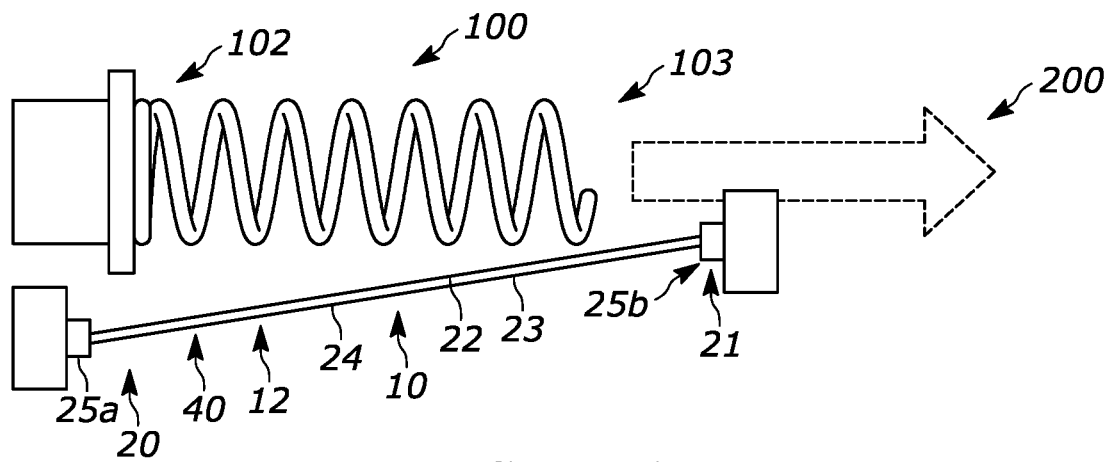
FIG. 2 of the drawings is a side elevational view of a configuration of the wire assembly of the present disclosure positioned in an operative environment, showing, in particular, a helical antenna in close proximity to the wire assembly, with the helical antenna radiating a signal in a direction shown.
Figure 3:
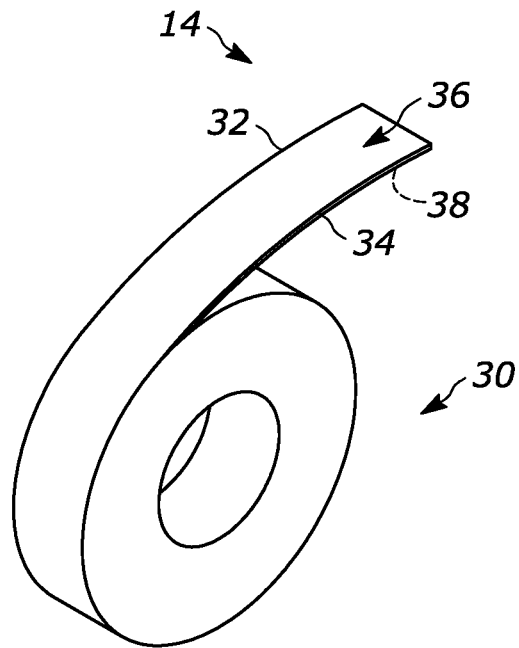
FIG. 3 of the drawings is a tape of the RF insulative wrap of the present disclosure.
Figure 4:
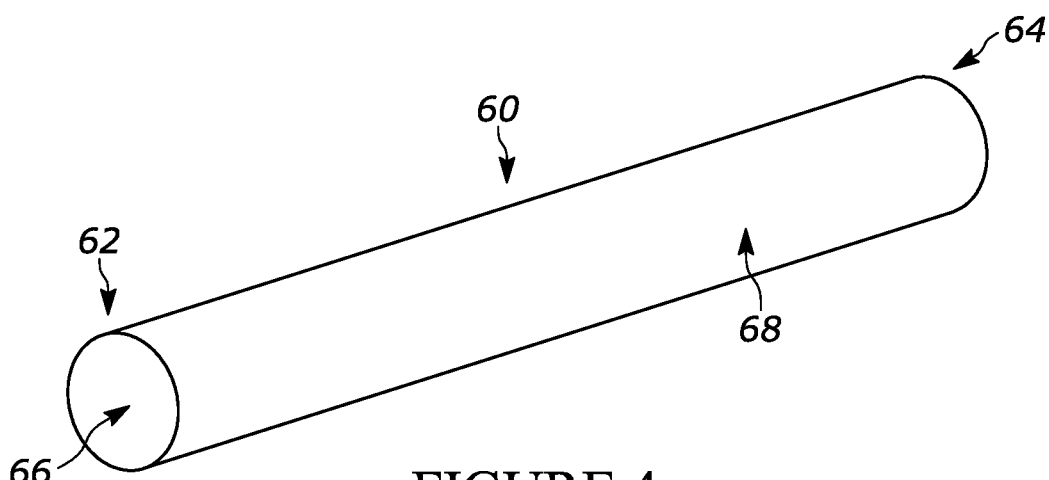
FIG. 4 of the drawings is a shrink tube of the RF insulative wrap of the present disclosure.
Figure 5:
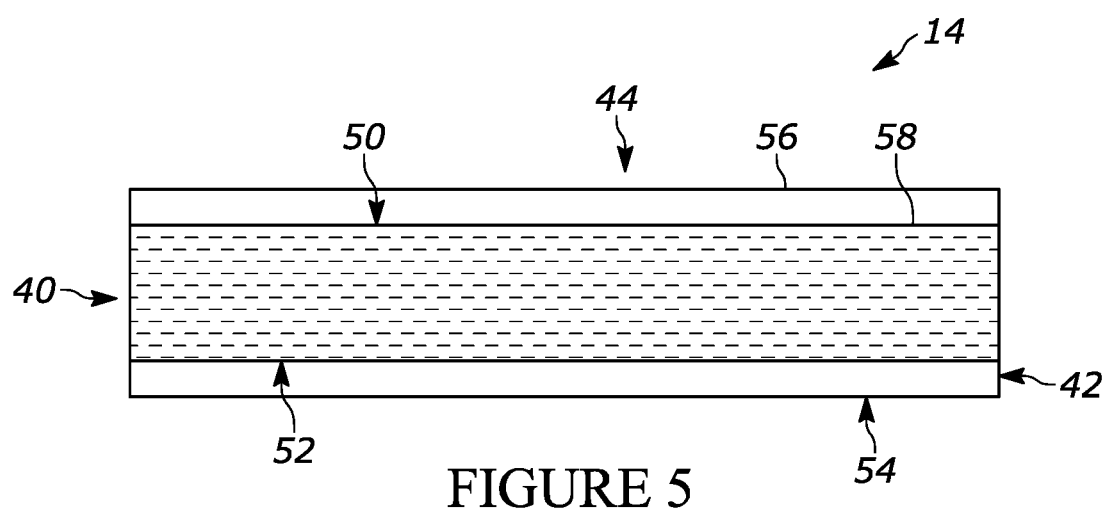
FIG. 5 of the drawings is a cross-sectional configuration of the RF insulative wrap of the present disclosure.
Figure 6:
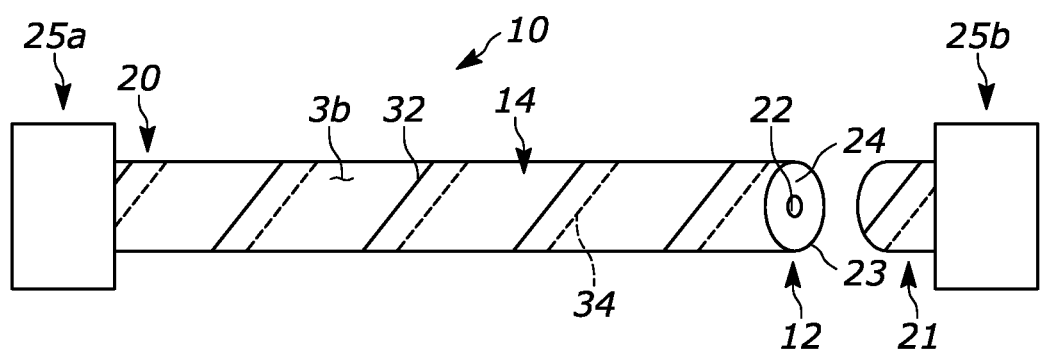
FIG. 6 of the drawings is a side elevational view with a partial cross-sectional configuration shown therein of the RF insulative wrap of the present disclosure.

Referring now to the drawings and, in particular, to FIG. 1, the wire assembly is shown generally at 10. In the configuration shown in FIG. 2, the wire assembly is shown as being in close proximity to an antenna, and in this case a helical antenna 100 having a first end 102 and a second end 103. It will be understood that the helical antenna generally radiates in the direction shown by the arrow 200. It will be understood that the presence of the wire assembly 10 comprising unshielded conductors has an impact (typically undesirable) on the radiative distribution pattern of the helical antenna. It will be understood that the disclosure is not limited to use with a helical antenna, but can be utilized in association with any number of different types of antennas, or combinations of antennas that are in relatively close proximity with each other, including, but not limited to, Yagi, quasi-Yagi, log-periodic, Vivaldi or other slot-based antennas among other antenna types. The particular antenna shown in the figures is to be deemed to be solely exemplary. Additionally, the relative position of the wire assembly (including the particular voltage and current across the wire assembly, as well as the resistance of the wire assembly) can be varied within the scope of the present disclosure.

In the configuration shown, the wire assembly 10 includes conductor 12, connectors such as connectors 25a, 25b and RF insulative wrap 14. The conductor 12 comprises at one conductive element, and more preferably a pair of conductive elements (i.e., first conductive element 22 and second conductive element 23) that extend between first end 20 and second end 21. In other configurations, there may be more than a pair of conductive elements. Additionally, it is contemplated that the conductors may be placed in different relationships with each other, for example, a pair of conductive elements may be twisted so as to form a twisted pair, or they may be in a side by side, generally parallel configuration (within a shield, or otherwise), or they may be in a coaxial configuration or a triaxial configurations). Additionally, the same may be done with more than a pair of wires, that is they may be related to each other in the manners described, among others. It has been shown that the present disclosure has favorable results even where a coaxial association of two conductors is utilized, as compared to the same conductors without the RF insulative wrap 14.

Figure 1A:
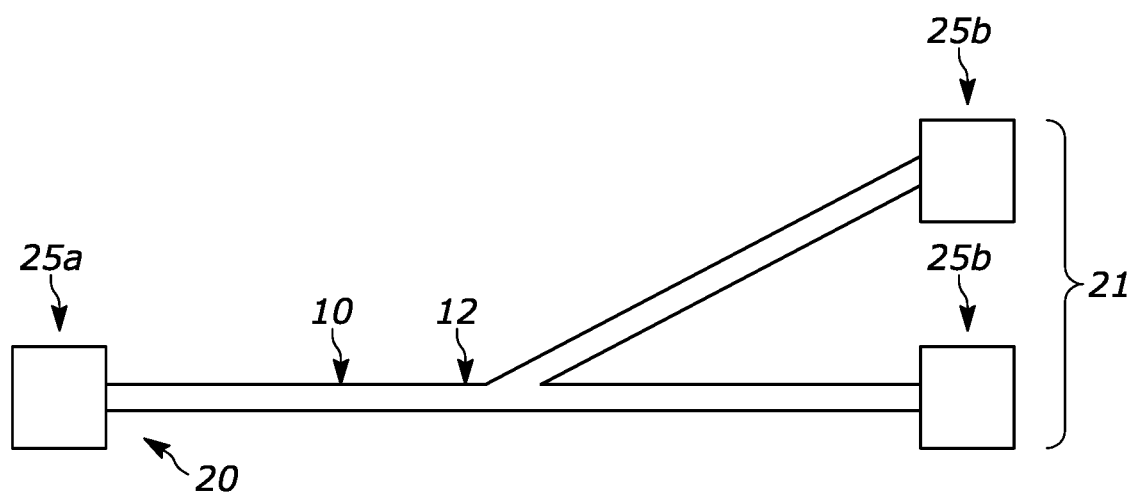
FIG. 1a of the drawings is a side elevational view of a configuration of the wire assembly of the present disclosure that includes a branched assembly wire assembly.

In some configurations, the respective ends of the first and second conductive elements can terminate in a connector, with the first end terminating at connector 25a and the second end terminating at connector 25b. In other configurations, the respective ends may be soldered, or otherwise fastened through fasteners to other structures, such as electrical elements, electronic integrated circuits or boards, other antenna, among other structures wherein such electrical conduction is necessitated. It will further be understood that the wire assembly may include multiple first and/or multiple second ends, and that reference to a first end or a second end is in the context of one or more such ends. That is, the conductor may be of the branching type, as opposed to the point to point shown in the drawings. The disclosure and the claims are directed to both a point to point as well as branching configurations (i.e., multiple first ends and/or second ends, such as is shown in FIG. 1a).

It will be understood that the first and second conductive elements (or more) typically include an insulator that maintains the two conductive elements electrically DC and AC isolated from each other. Such insulation may comprise sheathing or other insulation such as foam or the like in the case of coaxial configurations. In other configurations, the insulation may comprise a polymer based material which can be molded or otherwise extended over the conductive elements. In some instances the insulation may bind the conductive elements together physically while the conductive elements remain electrically isolated from each other. The particular configuration of any insulation is shown herein for illustrative purposes, and the disclosure is not limited to any particular configuration of the insulation, or to any particular type of insulation.

The RF insulative wrap can be provided in multiple different forms. For example, the RF insulative wrap may form a tape, such as tape 30 which is wound onto a core. The tape has a length, and a width, that is defined by the opposite side edges 32, 34. The tape includes an upper surface 36 and a lower surface 38. The tape, for example, may have uniform widths, or non-uniform widths, of any width, and more preferably that range, from 0.125" to 3" and more preferably that range between 0.25" and 1.5" and more preferably that range between 0.375" and 0.875". Again, the particular width is not to be deemed limiting.

In another configuration, the RF insulative wrap is in the form of a heat shrink tube 60 having a first end 62 and a second end 64. The heat shrink tube 60 defines bore 66 and outer surface 68. It will be understood to those of skill in the art, shrink tubing generally comprises a polyolefin wherein the diameter of the tubing shrinks with generally nominal if any shrinking of the tubing in the lengthwise direction. It will be understood that the heat shrink tube may comprise any number of different lengths and diameters.

The insulative wrap, whether provided as a tape or a heat shrink tubing includes magnetic sheet 40, adhesive layer 42 and surface film 44. Other layers may also be present in addition to these layers, or as a supplement to these layers. In some configurations, the adhesive layer may be omitted, or may be a partial layer, among other configurations. In the shrink tube configuration, the adhesive layer may be fully omitted, as reliance is placed on the shrinking of the tubing around the conductor. In another configuration, a hot, meltable glue may be utilized that includes ferrite material within the meltable matrix.

The magnetic sheet 40 includes top 50 and bottom 52. The magnetic sheet comprises a magnetic metal powder in a plastic matrix. The magnetic metal powder is encased in plastic to retain its insulated state, and arranged corresponding to the orientation of the magnetic field to form a layer on the surface of the sheet. Generally, the magnetic material (which preferably comprises a flat powder) is uniformly dispersed within the plastic. It will be known to those of skill in the art that there are multiple both dry and wet methods of manufacturing the magnetic sheet. It is contemplated that the magnetic sheet may have a thickness between 0.02 mm and 2.00 mm, and more preferably between 0.05 mm and 0.50 mm.

The adhesive layer can be applied to the bottom 52 of the magnetic sheet 40 and forms a tacky bottom surface 54. A release liner may be placed over the bottom surface in some configurations and may be omitted in others. A surface film 44 may be placed over the magnetic sheet 40 as a protective layer wherein the bottom surface 58 of the surface film is coupled to the top surface 50 of the magnetic sheet. Such a surface film may comprise a clear or opaque polymer that provides protection to the underlying magnetic sheet.

One material from which the insulative wrap may be formed is from the noise suppression sheets offered under the name Flexield, IFL series, by TDK which has a US manufacturing facility in Uniondale, N.Y. One particular material that was formed into a wrap is available from TDK under the name IFL12, and, in particular part number IFL12-050RN1HRx300 which was made into strips suitable for wrapping. Another part number that was tested comprised IFL12-200RN1HRx300. The properties of these materials are incorporated by reference in their entirety.

In operation, to form a wire assembly, a conductor was provided. In the configuration shown, the conductor comprises a coaxial cable. The coaxial cable includes opposing wire harnesses 25a and 25b, and a length of approximately 10" to 20". A strip of the aforesaid IFL12 material was prepared. The strip had a width of approximately 0.375" and 0.625" and a length that was multiple feet. The strip was helically wound about the conductor between the opposing wire harnesses 25a, 25b in an overlapping configuration. The amount of overlap was between 25% and 50%, while variations are contemplated from an overlap of as little as a few percent to an overlap of over 90%. The helical angle can be varied as well, depending on the desired overlap. While the entirety of the conductor was covered, it is envisioned that portions of the conductor may have the insulative wrap whereas other portions may be free from insulative wrapping.

The conductor was placed near a helical antenna, such as helical antenna 100, and extended along the helical antenna between the first end and the second end. Tests were conducted with the conductor prior to wrapping and then with the wire assembly according to the present disclosure and also with the antenna not having a conductor in close proximity (or in an affect zone, that is a zone wherein the conductor has a negative effect on the radiative distribution pattern sufficient to warrant design concern to one of skill in the art). For example, the conductor may be placed within 12-18" or less of the antenna for smaller antenna and further for larger antenna.

It was observed that the placement of the conductor in the orientation shown had a negative effect on the radiative distribution pattern of the antenna. When the wire assembly of the present disclosure was positioned in the same position, very little (typically <2 dB and, more preferably <1 dB at relevant frequencies) negative effect on the radiative distribution pattern of the antenna was observed. That is, the radiative distribution pattern of the antenna was virtually the same whether the wire assembly of the present invention was present or not present, whereas a distinct negative effect (>6 dB at certain relevant frequencies) was realized with the conductor not having the RF insulative wrap. Additionally, such differences were observed with conductors such as coaxial conductors just as would be observed with other types of conductor pairs as described above.

The foregoing description merely explains and illustrates the disclosure and the disclosure is not limited thereto except insofar as the appended claims are so limited, as those skilled in the art who have the disclosure before them will be able to make modifications without departing from the scope of the disclosure.

What is claimed is:

1. An antenna installation comprising:
   an antenna having a first end and a second end, the antenna defining a radiative distribution pattern, the antenna comprising a helical antenna having an inner region defined by a winding diameter;
   a wire assembly positioned in close proximity to the antenna, while being in a side by side configuration so as to be spaced apart from the helical antenna, the wire assembly including:

a conductor having a first end and a second end, the conductor further including at least one conductive element extending between the first end and the second end, the at least one conductive element having a diameter that is smaller that is smaller than the winding diameter;

a first connector at the first end of the conductor and a second connector at the second end of the conductor, the helical antenna being spaced apart therefrom; and an RF insulative wrap encircling the conductor between the first end and the second end, the RF insulative wrap comprising a magnetic sheet having a magnetic metal powder within a polymer matrix, the RF insulative wrap being spaced apart from the helical antenna, with the wire wrap being outside of the inner region of the helical antenna and spaced apart therefrom, so as to be in a side by side, separated, configuration with the helical antenna.

2. The antenna installation of claim 1 wherein the wire assembly is positioned within 18" of the antenna.

3. The antenna installation of claim 2 wherein the wire assembly is positioned so as to extend along a portion of the antenna between a first end and a second end of the antenna, while being spaced apart therefrom.

4. The antenna installation of claim 1 wherein the at least one conductive element comprises a pair of conductive elements in at least one of a coaxial arrangement, a triaxial arrangement, a twisted pair arrangement, and a side by side arrangement, and within a conductive outer shield.

5. The antenna installation of claim 1 wherein the RF insulative wrap comprises a helical winding along the conductor between the first end and the second end.

6. The antenna installation of claim 5 wherein the helical winding is formed from a strip having a first side edge and a second side edge opposite the first side edge defining a width, wherein the helical winding overlaps itself between the first end and the second end.

7. The antenna installation of claim 1 wherein current passes through the conductor between the first end and the second end.

* * * * *